(12) United States Patent
Passi et al.

(10) Patent No.: US 12,140,714 B2
(45) Date of Patent: Nov. 12, 2024

(54) WAVEFORM GENERATOR

(71) Applicant: STMicroelectronics S.r.l., Agrate Brianza (IT)

(72) Inventors: Stefano Passi, Pavia (IT); Roberto Giorgio Bardelli, Como (IT); Anna Moroni, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 942 days.

(21) Appl. No.: 17/176,284

(22) Filed: Feb. 16, 2021

(65) Prior Publication Data

US 2021/0270950 A1 Sep. 2, 2021

(30) Foreign Application Priority Data

Feb. 28, 2020 (IT) .......................... 102020000004231

(51) Int. Cl.
*G01S 7/524* (2006.01)
*G06F 5/08* (2006.01)
(Continued)

(52) U.S. Cl.
CPC ............ *G01S 7/524* (2013.01); *G06F 9/3004* (2013.01); *G06F 5/08* (2013.01); *G06F 5/085* (2013.01); *G06F 5/10* (2013.01); *G11C 19/00* (2013.01)

(58) Field of Classification Search
CPC .......... G01S 7/524; G06F 9/3004; G06F 5/08; G06F 5/085; G06F 5/10; G11C 19/00; G11C 19/38
See application file for complete search history.

(56) References Cited

U.S. PATENT DOCUMENTS 5,781,066 A * 7/1998 Parisi ...................... H03F 1/526
330/51
6,491,633 B1 * 12/2002 Krishnan ............... A61B 8/481
600/458
(Continued)

FOREIGN PATENT DOCUMENTS

CN 1072810 A 6/1993
CN 1117635 A 2/1996
(Continued)

OTHER PUBLICATIONS

CN First Office Action and Search Report for counterpart CN Appl. No. 202110220040.7, report dated Mar. 18, 2024, 10 pgs.
(Continued)

*Primary Examiner* — Isam A Alsomiri
*Assistant Examiner* — Joseph C Fritchman
(74) *Attorney, Agent, or Firm* — Crowe & Dunlevy LLC

(57) ABSTRACT

A waveform generator includes a system control unit and signal channels controlled by the system control unit and configured to supply driving signals for driving a respective transducer of an array of transducers. Each signal channel includes a sequential access memory having rows, where each row contains an instruction word configured to generate a respective step of a waveform to be generated. A memory output of the sequential access memory is defined by an output row at a fixed location. The waveform to be generated is defined by a block of instruction words. Each signal channel also includes an internal control unit that is configured to sequentially move the content of the sequential access memory, based on the instruction word currently at the memory output, so that sequences of instruction words are provided at the output row.

32 Claims, 7 Drawing Sheets

(51) Int. Cl.
*G06F 5/10* (2006.01)
*G06F 9/30* (2018.01)
*G11C 19/00* (2006.01)

(56) References Cited

U.S. PATENT DOCUMENTS

| | | | | |
|---|---|---|---|---|
| 8,572,143 | B2* | 10/2013 | Dippon | G06F 1/0328 |
| | | | | 708/271 |
| 10,194,973 | B2 | 2/2019 | Wiener et al. | |
| 2006/0061232 | A1* | 3/2006 | Min | H02N 2/147 |
| | | | | 310/317 |
| 2006/0218341 | A1* | 9/2006 | Nolte | G11C 19/38 |
| | | | | 711/109 |
| 2012/0086627 | A1* | 4/2012 | Chen | G09G 3/3677 |
| | | | | 345/100 |
| 2015/0080725 | A1* | 3/2015 | Wegner | A61B 8/4461 |
| | | | | 600/443 |

FOREIGN PATENT DOCUMENTS

| | | | |
|---|---|---|---|
| CN | 102694578 | A | 9/2012 |
| EP | 0543294 | A1 | 11/1992 |
| GB | 1490549 | A | 11/1977 |
| GB | 2136228 | A | 9/1984 |

OTHER PUBLICATIONS

IT Search Report and Written Opinion for IT Appl. No. 102020000004231 dated Oct. 12, 2020 (11 pages).
EPO Search Report and Written Opinion for counterpart EP Appl. No. 21159784.4, report dated Sep. 20, 2023, 8 pgs.

* cited by examiner

WAVEFORM GENERATOR

PRIORITY CLAIM

This application claims the priority benefit of Italian Application for Patent No. 102020000004231, filed on Feb. 28, 2020, the content of which is hereby incorporated by reference in its entirety to the maximum extent allowable by law.

TECHNICAL FIELD

The present invention relates to a waveform generator.

BACKGROUND

As is known, many applications involve use of waveform generators to drive arrays of transducers. For example, in ultrasound imaging systems a linear or two-dimensional array of piezoelectric transducers are alternately used to generate beams of ultrasound waves and to receive echoes produced by interactions of the beams with investigated targets. During the step of beam generation, the transducers are driven by digital waveform generators and analog pulsers. Waveforms are commonly defined by sequences of discrete values, for example two or more separate voltage values. Groups of transducers or individual transducers (channels) may be separately driven to improve control of the features of the ultrasound beam, for example, by exploiting beamforming techniques. Precise control of delay of driving signals received by the transducer may be critical, because phase difference directly determines constructive or destructive interference and the features of the beam.

In order to meet ever-increasing demand in terms of accuracy and resolution, it is generally desired to speed up the system clock and frequencies as high as 200 MHZ (and a time resolution of 5 ns) have been reached. In addition to resolution, flexibility is also to be taken into consideration so that several waveforms may be made available for different purposes and investigations. Special waveform generators have been proposed to achieve requirements of resolution and flexibility. Waveform generators of a first type are based on finite state machines, which define sequences of states in terms of voltage levels. A time counter and a pulse counter allow for the determination of the appropriate duration of the pulses and overall length (number of pulses) of the sequences. While waveform generators of this kind may be effective in reaching a high resolution, however, only a relatively limited range of simple waveform may be obtained.

In another type of known waveforms generators, parameters of waveforms are stored in arrays of volatile or non-volatile memory in the form of succession of voltage levels and corresponding time durations which define states of the waveform generator. The memory arrays may be scanned (for example, row by row) and waveforms are generated in accordance with retrieved voltage levels and time durations. In order to reduce the occupied memory when repeated sequences are generated, an address manager may be provided. The address manager allows for the repetition of sequences of states (voltage levels and associated time durations) which therefore may be stored just once instead of as many times as the desired repetitions.

Waveform generators based on memory arrays are more flexible and yield greater freedom in designing the waveform. Nevertheless, these generators suffer from limitations associated with aspect ratio and size of memory arrays. In applications which require independently driving a relatively large number of channels and a corresponding number of waveform generators, such as ultrasonography, signal routing may be a critical issue because of the arrangement of contact pins of the memory arrays and the number and length of the connection lines to reach each contact pin. Moreover, waveform generators use several small blocks of memory, such as flash memory, normally one block for each channel. Area occupation of small blocks of memory is quite inefficient, however, because each block requires dedicated circuitry, including row and column decoders, sense amplifiers and reference generators.

There is a need in the art to provide a waveform generator which allows the above described limitations to be overcome or at least attenuated.

SUMMARY

In an embodiment, a waveform generator comprises: a system control unit; and a plurality of channels controlled by the system control unit and configured to supply a corresponding plurality of driving signals, wherein each driving signal is configured to drive a respective transducer of an array of transducers.

Each channel comprises: a sequential access memory having a plurality of rows, wherein each row stores an instruction word configured to generate a respective step of a waveform, and a memory output defined by an output row at a fixed location, wherein the waveform is defined by a block of instruction words; and an internal control unit configured to sequentially move content of the sequential access memory, based on the instruction word currently at the memory output, so that sequences of instruction words are provided at the output row.

In an embodiment, an electronic system comprises: an array of transducers configured to generate waves in response to driving signals; and a waveform generator (as described above) configured to generate the driving signals.

BRIEF DESCRIPTION OF THE DRAWINGS

For a better understanding of the invention, some embodiments thereof will now be described, purely by way of non-limiting example and with reference to the attached drawings, wherein.

DETAILED DESCRIPTION

Figure 1:
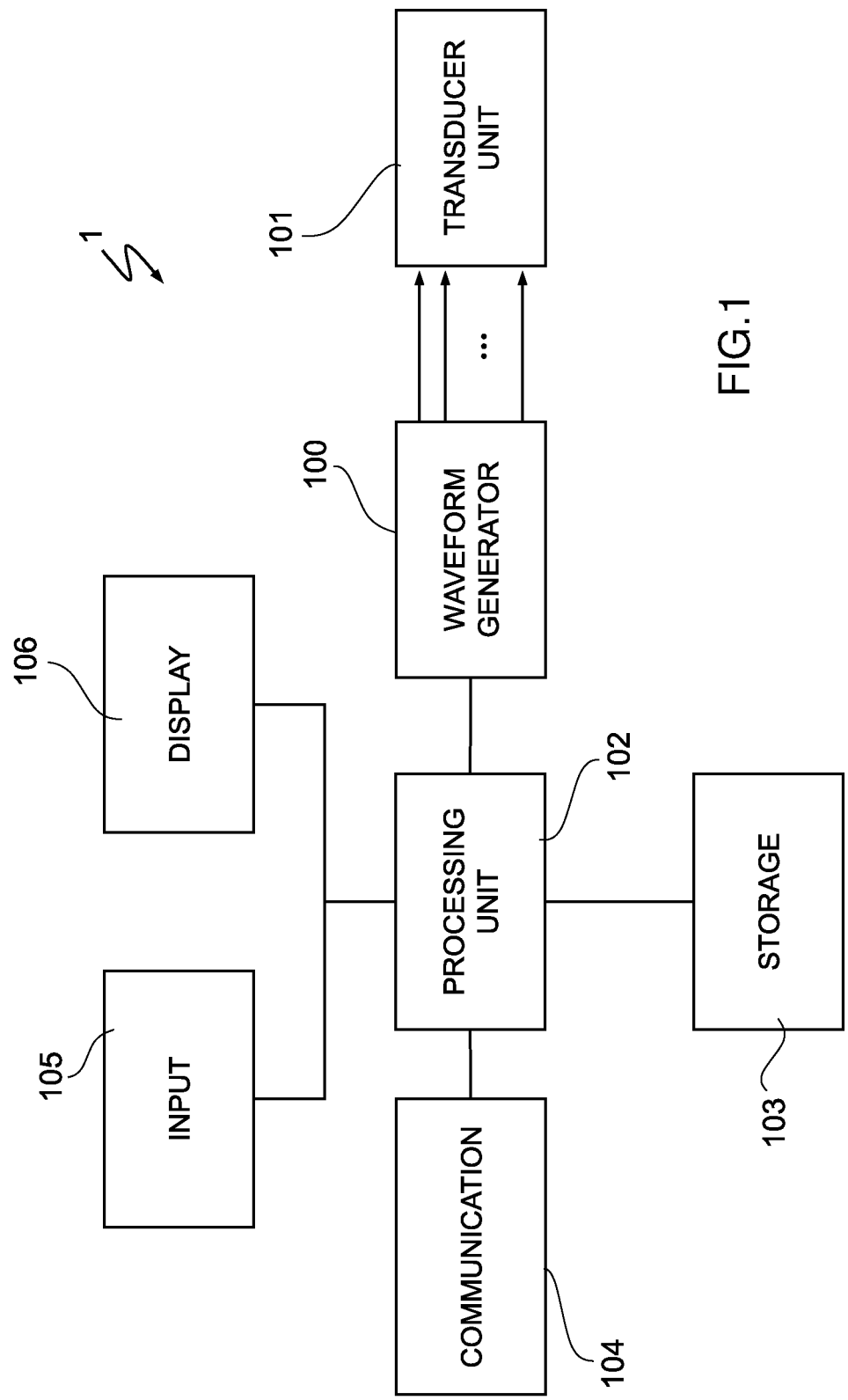
FIG. 1 is a simplified block diagram of an electronic system.

An ultrasound investigation device in accordance to an embodiment is illustrated in FIG. 1 and is designated as a whole by numeral 1. The ultrasound investigation device 1 may be used, for example, in medical echography or in ultrasound inspection of mechanical components. The invention, however, is not limited to ultrasound applications and may be advantageously exploited in any case where waveform generators are involved, especially to drive a plurality of transducers with synchronized waveforms.

The ultrasound investigation device 1 comprises a waveform generator 100 and a transducer unit 101. The ultrasound investigation device 1 may also comprise a processing unit 102, a storage unit 103, a communication device 104 for remote communication (e.g., wired or wireless communication through a computer network), an input device 105 and a display 106. In one embodiment, the waveform generator 100 and the transducer unit 101 may be integrated in an inspection head and remotely connected to the remaining components of the ultrasound investigation device 1. The processing unit 102, the storage unit 103, the communication device 104, the input device 105 and the display 106 may be integrated in a dedicated structure, in a personal, laptop or tablet computer or in smartphone.

Figure 2:
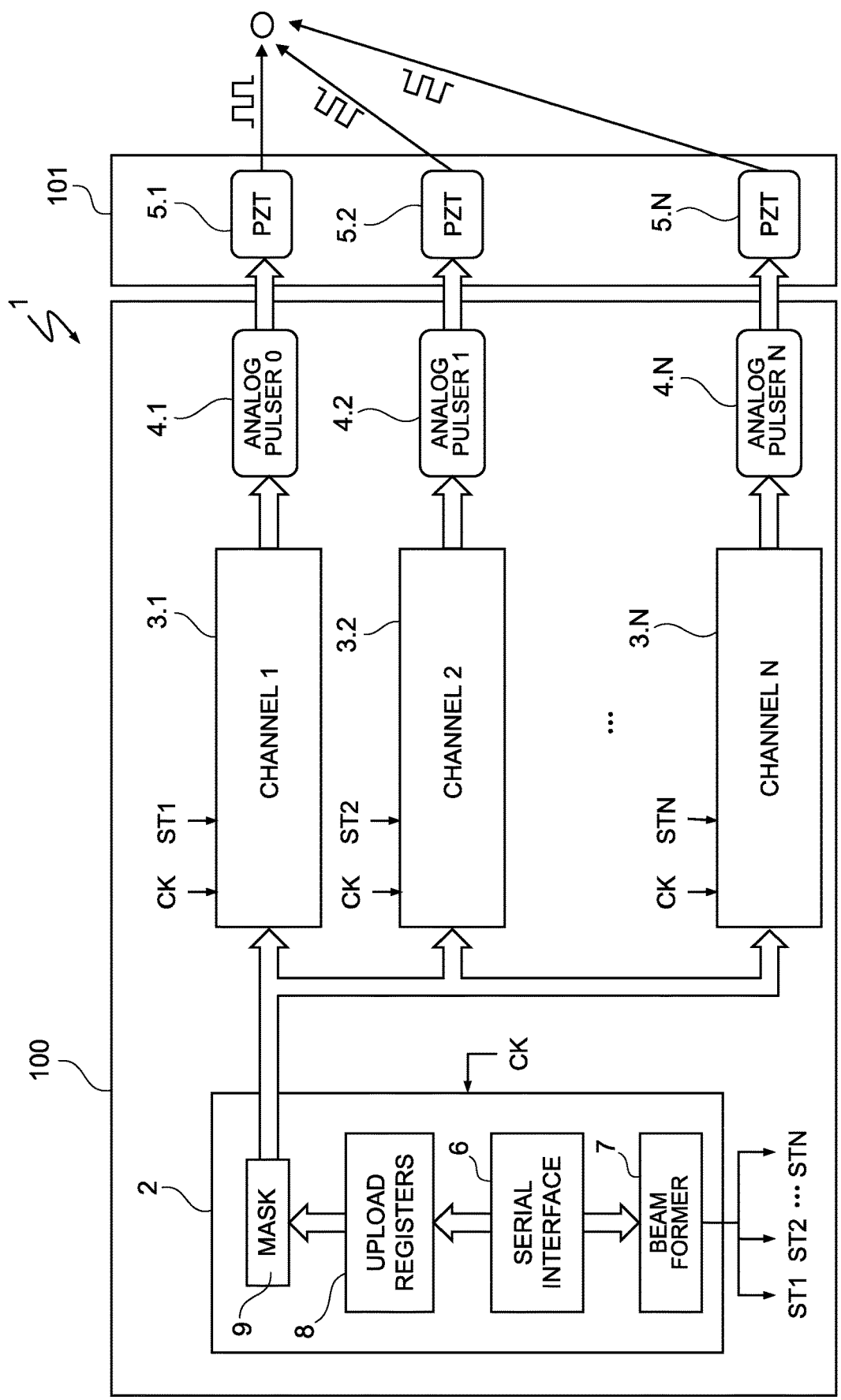
FIG. 2 is a more detailed block diagram of a portion of the electronic system of FIG. 1, including a waveform generator in accordance with one embodiment.

As illustrated in FIG. 2, the waveform generator 100 comprises a system control unit 2, a plurality of channels 3.1, ..., 3.N and a corresponding plurality of drivers 4.1, ..., 4.N fed by the respective channels 3.1, ..., 3.N. The transducer unit 101 comprises an array of ultrasound transducers 5.1, ..., 5.N coupled to respective drivers 4.1, ..., 4.N, N being the number of channels and ultrasound transducers (in an example, N=128). The ultrasound transducers 5.1, ..., 5.N may include piezoelectric transducers arranged, for example, in a linear or two-dimensional array. Each ultrasound transducer 5.1, ..., 5.N is driven by a respective channel 3.1, ..., 3.N through the respective driver 4.1, ..., 4.N. The drivers 4.1, ..., 4.N may be analog pulsers that convert low-voltage discrete signals into analog waveforms for the respective ultrasound transducers 5.1, ..., 5.N. The system control unit 2 and the channels 3.1, ..., 3.N receive a common system clock CK.

The system control unit 2 comprises a serial interface 6, a beamforming module 7, upload registers 8 and a mask module 9. The beamforming module 7 supplies the channels 3.1, ..., 3.N with start commands ST1, ..., STN, which are synchronized to create controlled interference of pressure waves generated by individual ultrasound transducers 5.1, ..., 5.N, thus determining beam features, such as propagation direction and shape of beam fronts.

Through the serial interface 6, parameters of the waveforms to be generated may be stored in the upload registers 8 and then uploaded into the channels 3.1, ..., 3.N. The parameters of the waveforms may be defined off-line with the aid of a wave design tool. The mask module 9 allows for the simultaneous sending of parameters to multiple selected channels 3.1, ..., 3.N, thus allowing parallel uploading of parameters.

Figure 3:
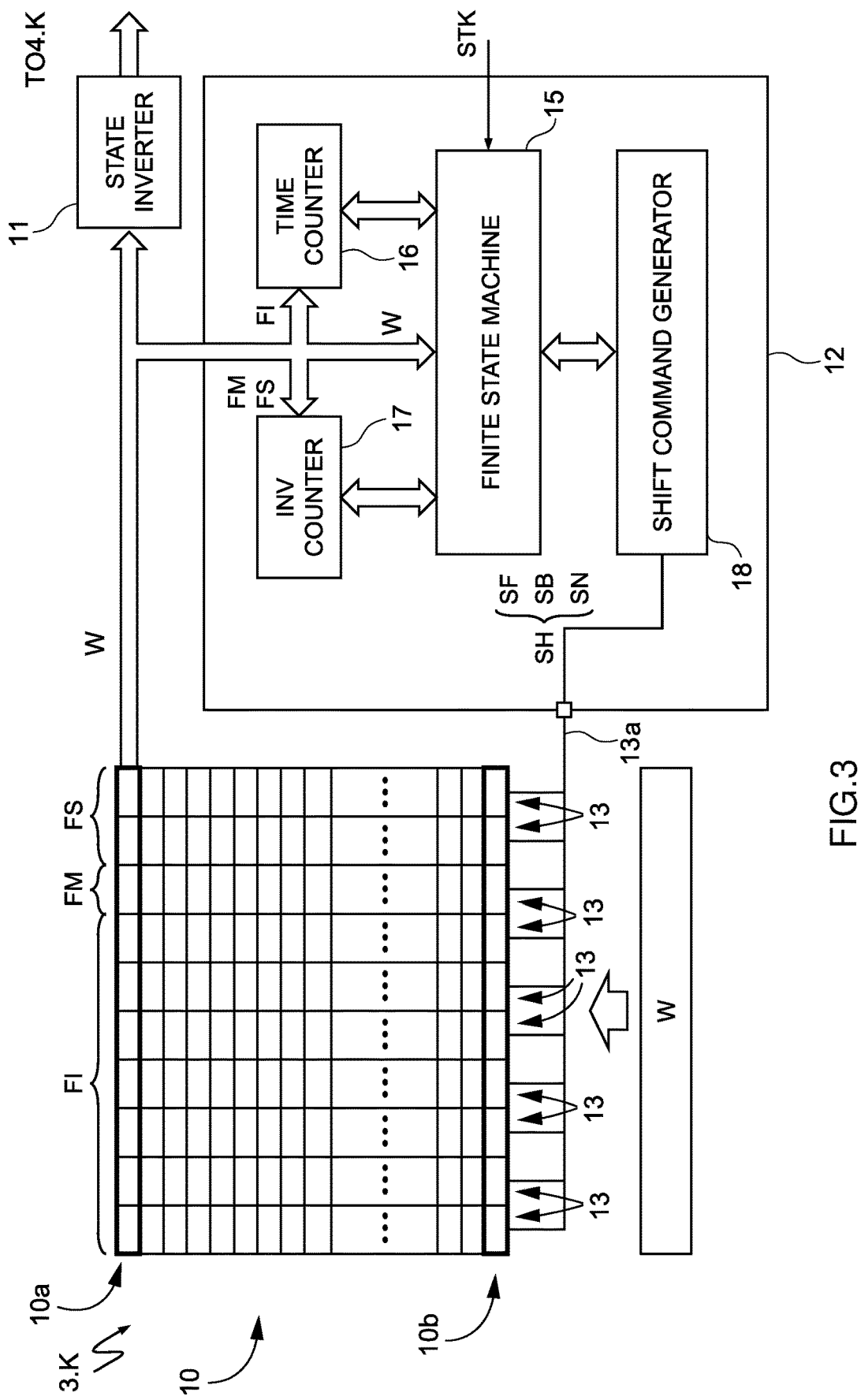
FIG. 3 is a more detailed block diagram of a portion of the waveform generator of FIG. 2.

FIG. 3 shows in detail one of the channels 3.1, ..., 3.N, which will be identified as 3.K, and reference will be made thereto, being it understood that all the channels 3.1, ..., 3.N are identical to one another in structure.

The channel 3.K comprises a bidirectional, circular, two-dimensional shift register 10, a state inverter module 11 and an internal control unit 12. The two-dimensional shift register 10 comprises in turn a plurality of bidirectional, circular, unidimensional shift registers 13 which are all of the same size and are configured to be operated in parallel such that the content of all the unidimensional shift registers 13 may be shifted in either direction simultaneously. For example, a single shift command SH may be provided to a common shift input 13a to each one of the circular shift registers 13. The shift command SH has a first logic value that causes the content of all the unidimensional shift registers 13 to be shifted in a first direction (e.g., shift forward) and a second logic value that causes the content of all the unidimensional shift registers 13 to be shifted in a second direction, opposite to the first direction (e.g., shift backwards). Another logic value may be used to cause the content of all the unidimensional shift registers 13 to remain unchanged (e.g., no shift). For the sake of convenience, in what follows the first direction and the second direction will be respectively referred to as forward direction and backward direction, respectively, or simply forward and backwards.

Hence, the two-dimensional shift register 10 defines a matrix having as many rows as the number of bits of each unidimensional shift register 13 and as many columns as the number of unidimensional shift registers 13. It is noticed that the unidimensional shift registers 13 are logically adjacent to one another, meaning that bits at the same position in different unidimensional shift registers 13 form a row of the two-dimensional shift register 10. However, the unidimensional shift registers 13 do not need to be also physically adjacent to one another. Generally, a shift register includes a plurality of cascaded bistable circuits having a common clock and configured such that the state of each bistable circuit is passed to the subsequent (or the preceding) one in the cascade in response to a shift forward command (or shift backwards command, respectively). For the two-dimensional shift register 10 to define a matrix, it is not necessary that the individual bistable circuits of logically adjacent unidimensional shift registers 13 are physically near one another. Instead, it is sufficient to define positions of bits (bistable circuits) in each one of the unidimensional shift registers 13 and to maintain the positions consistent in processing. One of the rows of the two-dimensional shift register 10 is provided with physical connections to the outside and defines a register output 10a.

Figure 4:
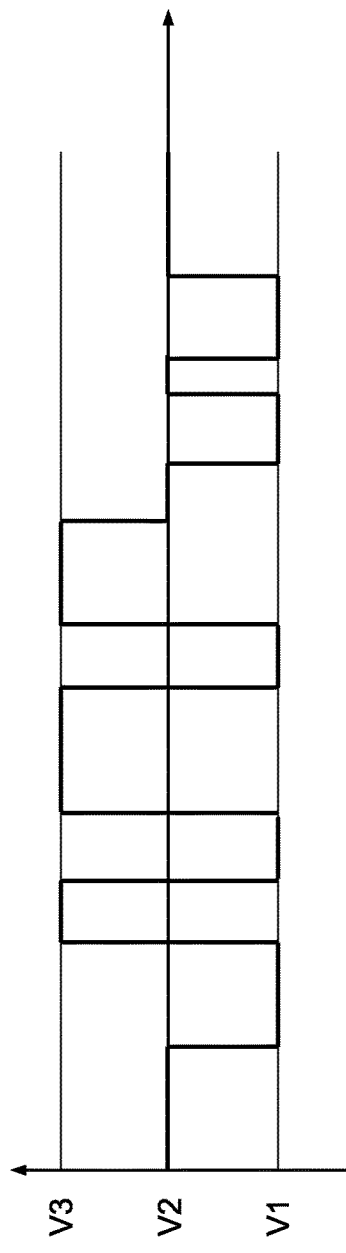
FIG. 4 shows an example of a waveform used in the waveform generator of FIG. 2.

The content of the two-dimensional shift register 10 may be shifted by rows. Each row defines a register word W and contains information on waveforms to be generated. Waveforms are generated as successions of steps or states, each having a respective one of a plurality of state logic values and a respective duration, which may be advantageously represented as a number of clock cycles. The state logic values include a plurality of values V1, ..., VM. In one example (see FIG. 4), the state logic values may comprise a low state value V1, a clamp or intermediate logic value V2 and a high state value V3. Waveforms are stored in the two-dimensional shift register 10 as blocks of respective consecutive words W, including at least a respective state logic value, a respective duration and possibly additional information and/or instructions for processing. At every step, one word W in a position corresponding to the register output 10a is read out and a portion of the waveform is generated based on information contained in the word W, as described in detail in what follows.

In one embodiment, each word W includes at least a first field or instruction field FI, e.g. 7 bits (one bit of each of seven unidimensional shift registers 13, not necessarily adjacent to one another), a second field or mode field FM, e.g. 1 bit (one bit of another unidimensional shift register 13), and a third field or state field FS, e.g. 2 bits of as many adjacent unidimensional shift registers 13 (one bit of each of two further unidimensional shift registers 13, not necessarily adjacent to each other).

Figure 5A:
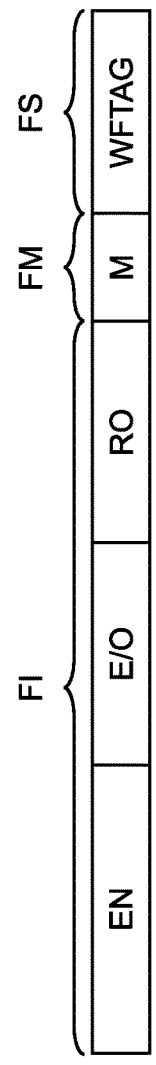
FIGS. 5A-5C show respective examples of instructions defining steps of waveforms used in the waveform generator of FIG. 1.
Figure 5B:
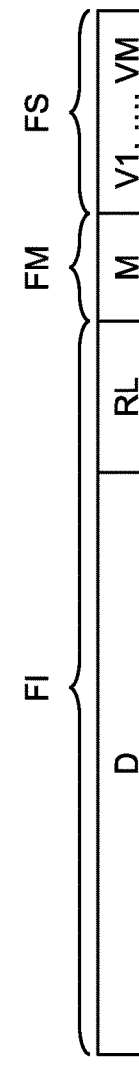
Figure 5C:
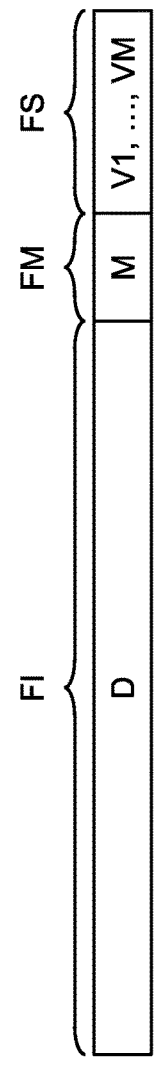

The instruction field FI contains information about the actions to be taken. Specifically, the instruction field FI may contain:
- an initialization string IS (FIG. 5A) defining an enable code EN to selectively enable and disable repetition of overall symmetric waveform patterns, a symmetry type code E/O alternatively defining whether overall symmetry is even or odd, a number of overall repetitions RO, defining how many times the overall sequence of steps is to be repeated;
- a duration D of a current step, e.g. in terms of number of clock cycles and a number of local repetitions RL (FIG. 5b) of symmetric portions of the waveform, if present; and
- a duration D (FIG. 5c) of a current step, e.g. in terms of number of clock cycles.

However, waveforms need not be symmetric or contain symmetric portions.

The mode field FM contains a mode flag M having logic values that define a standard operating mode and a start/repetition mode. In the standard operating mode, the shift direction of the two-dimensional shift register 10, whether forward (main) or backwards (reverse), is maintained, whereas in the start/repetition mode the shift direction is inverted from forward to backwards or vice versa. Pairs of mode flags M of subsequent words W setting the start/repetition mode define delimiters for sequences of steps to be repeated in the waveforms. The internal control unit 12 may be configured to identify the first and every odd received mode flag M setting the start/repetition mode as the start of a sequence of steps to be repeated; and the second and every even received mode flag M setting the start/repetition mode as the end of a sequence of steps to be repeated. As an alternative, the mode flag M may also have separate logic values to identify start and end of sequences of steps to be repeated.

The state field FS contains state logic values V1, ..., VM which are representative of respective levels of the waveform to be generated. The state field FS may contain also a dedicated start code (e.g., a logic value not used for the state logic values V1, ..., VM) that identifies the staring rows of blocks of words W defining waveforms. The state field FS of starting rows of blocks that define waveforms may contain a waveform identification tag WFTAG.

A sequential upload input 10b of the two-dimensional shift register 10 is coupled to the system control unit 2 via the mask module 9 for upload of waveform parameters. Advantageously, blocks of words W defining respective steps of one or more waveforms are sequentially loaded row by row, with a shift, for example, in the main direction at every iteration of the process.

With reference to FIG. 3, the internal control unit 12 comprises a control module 15, a time counter 16, a shift inversion counter 17 and a shift command generator 18. In one embodiment, the control module 15 may be a finite state machine.

The control module 15 receives each word W read at the register output 10a of the two-dimensional shift register 10 and carries out actions based on the content of the received words W.

The way the instruction field FI is interpreted by the control module 15 is determined by the content of the mode field FM and the state field FS.

The mode flag M in the mode field FM determines the standard operating mode or the start/repetition operating mode. In the standard operating mode, the content of the instruction field FI is interpreted as a duration of the current step of the waveform being generated. In the start/repetition mode, the content of the instruction field FI is interpreted as the initialization string IS or as a number of local repetitions RL depending on the content of the state field FS.

In the start/repetition mode, the content of the instruction field FI is interpreted as the initialization string IS in the presence of the start code in the state field FS and as a number of local repetitions RL in the presence of any of the other state logic values V1, ..., VM in the state field FS.

In one embodiment, the control module 15 is configured to carry out the following actions:
1) receiving system instructions that contain a reference tag TR identifying the waveform to be generated and shifting the two-dimensional shift register 10 until a row containing the word W with the matching waveform identification tag WT (WFTAG) in the state field FS is moved to the register output 10a; starting generation of the selected waveform;
2) initializing the time counter 16 in response to words W with the mode field FM setting the standard operating mode and incrementing the time counter 16 at every clock cycle until the duration D of the instruction field FI of the received word W has been reached;
3) shifting the content of the two-dimensional shift register 10 every time the waveform step defined in a respective word W has been completed;
4) initializing the shift inversion counter 17 in response to words W with the mode flag M that sets the start/repetition operating mode and causes an inversion of the shift direction (e.g., a mode flag M that identifies the end of a sequence to be repeated); and incrementing the shift inversion counter 17 every time a repetition of a sequence of steps between respective delimiters is completed until the number of local repetitions RL contained in the instruction field FI of the word W initiating the repeating sequence is reached (criteria for increment may be, for example, a mode flag M that identifies the start of a sequence to be repeated is received and the shift direction is backwards; or at every second inversion of direction);
5) terminating execution of a waveform on receiving a new word W containing the initialization string IS and the waveform identification tag WT of a subsequent waveform; and
6) repeating the whole block of words W defining a waveform if the enable code EN in the starting word W of the waveform being executed enables repetition of overall symmetric waveform patterns; setting the state inverter module 11 to even or odd repetition symmetry based on the symmetry type code E/O, as explained later.

The shift command generator 18 is controlled by the control module 15 and is configured to supply a shift forward command SF, a shift backwards command SB and a no shift command SN, the latter maintaining the current state of the two-dimensional shift register 10.

The state inverter module 11 receives the words W (or at least the state logic values V1, ..., VM) corresponding to the waveform steps to be currently executed from the register output 10a and has a normal operating mode, in which the state logic values V1, ..., VM are passed unchanged to the drivers 4.1, ..., 4.N, and an inverted operating mode, in which the state logic values V1, ..., VM are inverted before being passed to the drivers 4.1, ..., 4.N. In one embodiment, the state logic values V1, ..., VM are ordered from V1 to VM (e.g., the lowest and the highest), respectively, and the inverted state logic values, here indicated by V1', ..., VM', are obtained from the state logic values V1, ..., VM as follows:

$$VK' = V(M-K) \text{ with } K=1,2,\ldots,M$$

When the enable code EN in the starting word W of the waveform being executed enables repetition of overall symmetric waveform patterns and the whole block of words W has been executed, the state inverter module 11 is set in the normal operating mode or the inverted operating mode based on the symmetry type code E/O and the block of words W from the last row to the first row with the state logic values V1, ..., VM (normal operating mode) or the inverted state logic values, here indicated by V1', ..., VM' (inverted operating mode).

Arbitrary waveforms may be defined, loaded into the two-dimensional shift register 10 and then generated.

Figure 6:
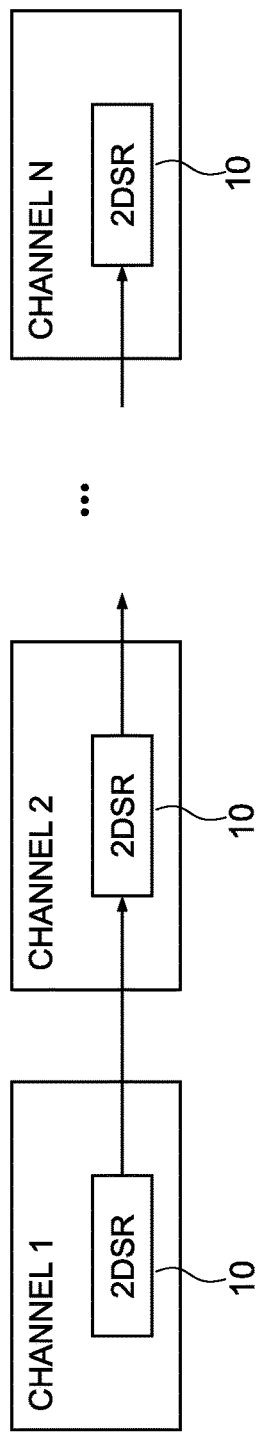
FIG. 6 is a simplified block of a portion of waveform generator in accordance with another embodiment.

In one embodiment, illustrated in FIG. 6, the two-dimensional shift registers (2DSR) 10 of the channels 3.1, ..., 3.N are series-connected to one another and blocks of words W defining waveforms may be sequentially moved between consecutive channels 3.1, ..., 3.N. This feature may be very useful in ultrasound imaging device implementing sliding windows and also allows to carry out scan tests. In circuits that combine logic networks and memory elements, such as flip-flops or shift registers, scan tests are used to check correct operation of the logic networks. To this end, a known state is loaded in the memory elements, a processing step (or a sequence of processing steps) is executed and the output is compared to an expected result. Connecting the memory elements in succession in the form of a shift register helps load the known state and read the output of the processing, since the structure that allows scan test implementation is the same that implements the main function. Likewise, connecting the two-dimensional shift registers 10 of the channels 3.1, ..., 3.N in series to form a global shift register makes it possible to perform scan tests on the logic components of the waveform generator 100.

Repetition of sequences allows compressed representation of waveforms having sequences of steps which are symmetric in respective state logic value V1, ..., VM and duration with respect to one of the steps of the sequence, the first part of the sequence being also repeated on sequence termination. For example, a sequence of steps such as (ABCBA)BC allows compressed representation. The sequence portion in parentheses is symmetric with respect to step C and the underscored portion is repeated on sequence termination.

Figure 7A:
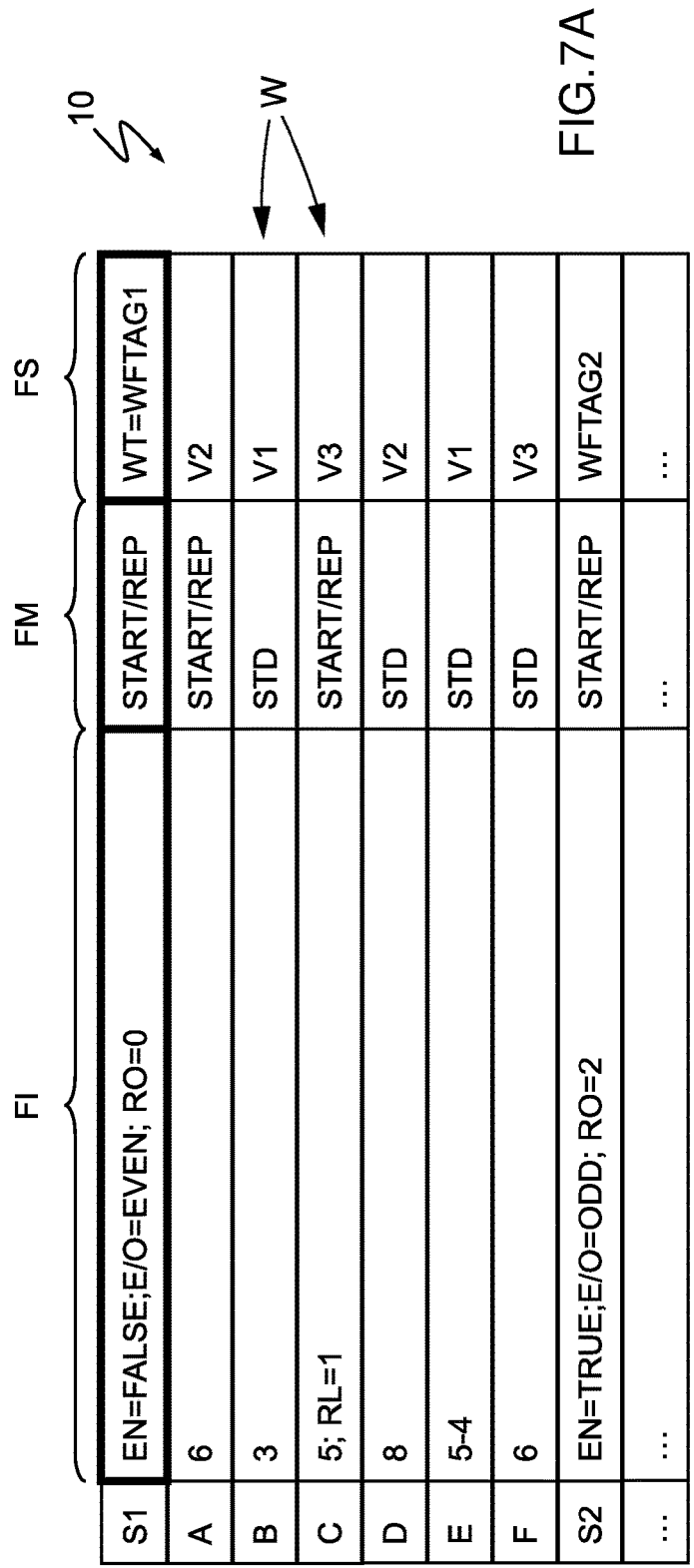
FIG. 7A is a schematic representation of an example of a block of instructions defining a waveform loaded in a sequential access memory of the waveform generator of FIG. 2.
Figure 7B:
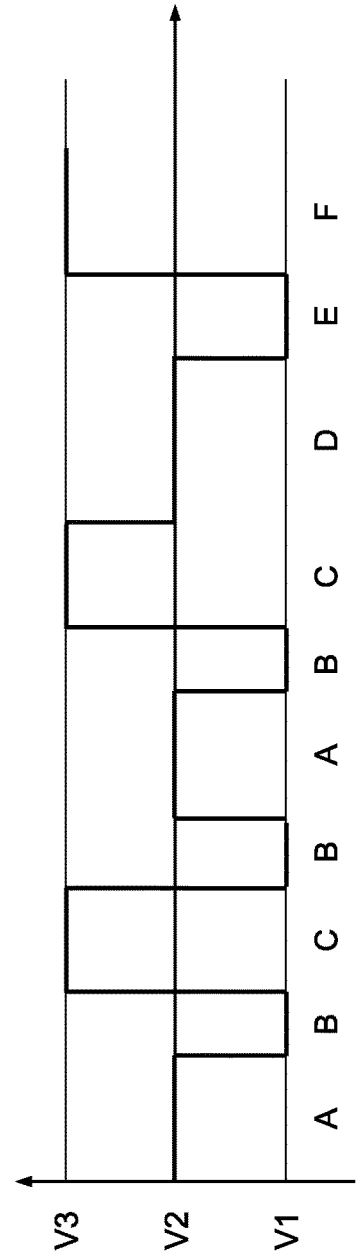
FIG. 7B shows the waveform of FIG. 7A.

FIGS. 7A and 7B show an example of a waveform (labeled WT=WFTAG1) including a plurality of steps, each of which has a respective one of three state logic values V1, V2, V3 and a respective duration, in terms of number of clock cycles. Specifically, FIG. 7A illustrates the content of a portion for the two-dimensional array 10 and FIG. 7B shows the succession of steps in time. For the sake convenience, steps are here identified as ABCBABCDEF and indicated in an auxiliary column, which however need not be included in the two-dimensional shift register 10. Row labeled S1 contains the starting word W with the waveform identification tag WT of the current waveform and overall parameters to initialize the control module 15. Thereafter, the control module 15 executes steps A, B and sends shift forward commands to the two-dimensional shift register 10. The first occurrence of the mode flag M defining the start/repetition mode is ignored.

At step C, the second received mode flag M defining the start/repetition mode is interpreted by the control module 15 as a delimiter of a sequence to be repeated and causes the shift direction to be inverted from main (forward) to reverse (backwards). The waveform portion defined in the word at step C is executed, the shift inversion counter 17 is initialized and the number of local repetitions RL may be stored in an auxiliary register, here not shown. Then, a shift backwards command is supplied to the two-dimensional shift register 10 and the step B is executed. The shift direction is maintained until another delimiter is reached. In the exemplary sequence, this is represented by the mode flag M of step A. Once the waveform portion defined in the word of step A has been executed, the shift direction is inverted from reverse (backwards) to main (forward) and the shift inversion counter 17 is incremented. Then, steps B and C are executed again. If the content of the shift inversion counter 17 matches the number of local repetitions RL stored in the auxiliary register (or directly taken from the instruction field FI of the word W at step C), the shift direction is maintained and steps D, E and F are executed in succession. Otherwise, if the content of the shift inversion counter 17 has not reached the number of local repetitions RL, the shift direction is changed again from main (forward) to reverse (backwards). Steps B, A, B, C are the repeated until the content of the shift inversion counter 17 is equal to the number of local repetitions RL.

When the last step of the sequence (F in the example) has been executed, the content of the two-dimensional shift register 10 is shifted in the main direction once again and the first step of next block, that defines the next waveform, is moved to the register output 10a. The word of the new block is interpreted by the control module 15 as a stop command and generation of the current waveform is terminated.

Figures 8A, 8B:
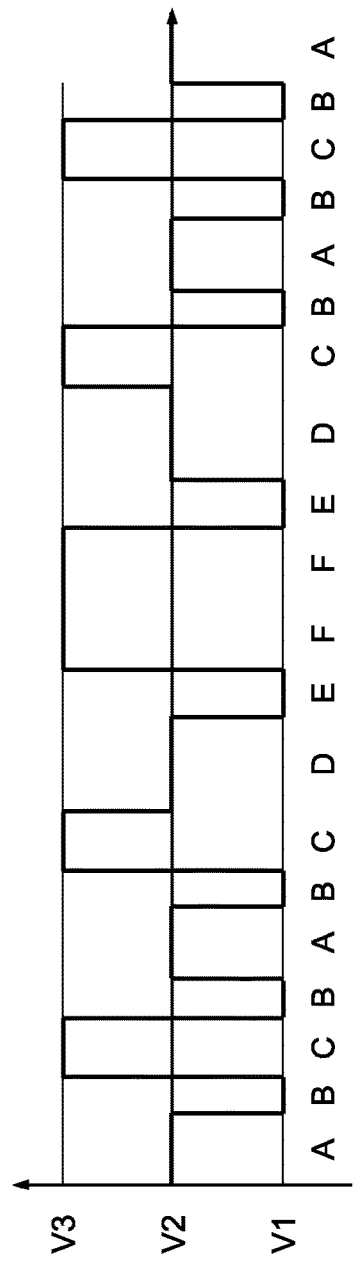
FIG. 8A is a schematic representation of another example of a block of instructions defining a waveform loaded in a sequential access memory of the waveform generator of FIG. 2.
FIG. 8B shows the waveform of FIG. 8A.

FIGS. 8A and 8B show another example of a waveform (labeled WT=WFTAG2) including the same sequence of steps ABCBABCDEF as the sequence of waveform WFTAG1 of FIGS. 7A and 7B and, in addition, instructions for one overall repetition with even symmetry. Instructions are provided in the instruction field FI of the starting word W in the starting row labeled S2, namely through respective values of the enable code EN (e.g., TRUE), of the symmetry type code E/O (e.g., EVEN) and of the number of overall repetitions RO (e.g., 1). In this case, the shift direction is inverted for local repetitions as for the waveform WFTAG1 of FIGS. 7A and 7B and, in addition, when the last row of the block defining the current waveform WFTAG2 is reached. At this stage, the whole sequence of steps, including local repetitions, is executed in the reverse direction as FEDCBABCBA.

Figures 9A, 9B:
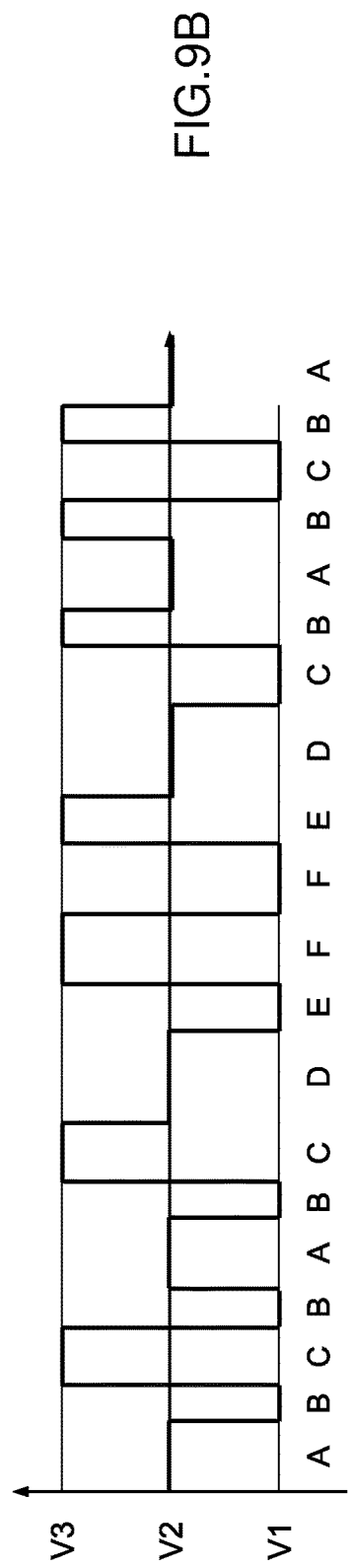
FIG. 9A is a schematic representation of a further example of a block of instructions defining a waveform loaded in a sequential access memory of the waveform generator of FIG. 2.
FIG. 9B shows the waveform of FIG. 9A.

FIGS. 9A and 9B show another example of a waveform (labeled WT=WFTAG3) including the same sequence of steps ABCBABCDEF as the sequence of waveform WFTAG1 of FIGS. 7A and 7B and, in addition, instructions for one overall repetition with odd symmetry. Instructions are provided in the instruction field FI of the starting word W in the starting row labeled S2, namely through respective values of the enable code EN (e.g., TRUE), of the symmetry type code E/O (e.g., ODD) and of the number of overall repetitions RO (e.g., 1). In this case, the shift direction is inverted as for the waveform WFTAG2 of FIGS. 8A and 8B and, in addition, the state inverter module 11 is set in the inverted operating mode, whereby the state logic values V1, V2, V3 are inverted before being passed to the drivers 4.1, . . . , 4.N. Accordingly, the drivers 4.1, . . . , 4.N receive inverted states V1'=V3, V2'=V2, V3'=V1.

Sequences of steps that define waveforms very often include periodic or repeating portions. The waveform generator in accordance with the invention advantageously provides for compressed waveform representation and storage, thus allowing considerable saving of memory required. As shown in the examples of FIGS. 7A, 7B, 8A, 8B and 9A, 9B, the waveform generator is capable of executing the forward sequence, the forward and reverse sequences and the forward and reverse sequences with inverted states with no need for additional memory.

Moreover, virtually any kind of waveform may be generated by the waveform generator in accordance with the invention.

Another important advantage of the invention resides in that a two-dimensional shift register, made up of a plurality of parallel-operated unidimensional shift register, is used in place of a conventional random access memory such as a flash memory. Contrary to conventional random access memories, shift registers do not have predefined requirements for shape and aspect ratio. A shift register is essentially made of cascaded bistable circuits and, once the series connection is achieved, there are practically no other requirements as to where individual bistable circuits are to be located. Moreover, a single input row and a single output row are sufficient to operate the two-dimensional shift register. Flexible design and a low number of connections make routing of signals much easier and the number of channels and corresponding transducers may be significantly increased. The greater number of independent channels and transducers allows to receive more information and to perform a more complete inspection. In case two-dimensional arrays of transducers are used, three-dimensional images may be produced.

Additionally, shift registers do not require addressing circuitry or a read/write interface. On the one side, further saving of silicon area is made available and, on the other hand, control logic may be very simple, thus making shift registers intrinsically quick in responding to commands. In particular, there is no need for address decoding, which introduces some delay, and three command lines or two command lines with a logic gate are sufficient to supply all required commands (shift forward command SF, shift backwards command SB and a no shift command SN). This allows to achieve extremely fine time resolution, in the order of 5 ns, and comparatively precise space (depth) resolutions.

Finally, it is evident that modifications and variations may be made to the waveform generator described, without thereby departing from the scope of the present invention, as defined in the annexed claims.

The invention claimed is:

1. A waveform generator, comprising:
a system control unit; and
a plurality of channels controlled by the system control unit and configured to supply a corresponding plurality of driving signals, wherein each driving signal is configured to drive a respective transducer of an array of transducers;
wherein each channel comprises:
a sequential access memory having a plurality of rows, wherein each row stores an instruction word configured to generate a respective step of a waveform, and a memory output defined by an output row at a fixed location, wherein the waveform is defined by a block of instruction words; and
an internal control unit configured to sequentially move instruction words of the sequential access memory, based on the instruction word currently at the memory output, so that sequences of instruction words are provided at the output row.

2. The waveform generator of claim 1, wherein the sequential access memory comprises a two-dimensional shift register formed by said plurality of rows, configured to be shifted by rows selectively in one of a first direction and a second direction, wherein the second direction is opposite to the first direction.

3. The waveform generator of claim 2, wherein the internal control unit is configured to shift the sequential access memory based on the content of the instruction word currently at the memory output.

4. The waveform generator of claim 1, wherein the sequential access memory comprises a plurality of bidirectional, circular, unidimensional shift registers forming columns of the sequential access memory, wherein said bidirectional, circular, unidimensional shift registers are all of a same size and are configured to be operated in parallel.

5. The waveform generator of claim 4, wherein the bidirectional, circular, unidimensional shift registers are configured to simultaneously receive a single shift command that has a first logic value causing content of all the bidirectional, circular, unidimensional shift registers to be shifted in a first direction and a second logic value causing content of all the bidirectional, circular, unidimensional shift registers to be shifted in a second direction, wherein the second direction is opposite to the first direction.

6. The waveform generator of claim 5, wherein the internal control unit is configured to shift all the bidirectional, circular, unidimensional shift registers based on the content of the instruction word currently at the memory output.

7. The waveform generator of claim 1, wherein the instruction word contains local sequence delimiters of sequences of instruction words to be repeated, and wherein the internal control unit is configured to invert a shift direction of the sequential access memory in response to the local sequence delimiters and inversion conditions.

8. The waveform generator of claim 7, wherein the instruction word containing the local sequence delimiters also contains repetition information defining a number of repetitions to be carried out for respective sequences of words to be repeated.

9. The waveform generator of claim 1, wherein the instruction word contains a duration and a state value of a respective driving signal defining a respective step of the waveform to be generated.

10. The waveform generator of claim 1, wherein a starting instruction word of a block of instruction words defining the waveform contains an identification tag identifying the waveform.

11. The waveform generator of claim 10, wherein the sequential access memory contains a plurality of blocks of instruction words, each block of instruction words defining a respective waveform and having a respective one of the starting instruction words, and wherein the internal control unit is configured to stop execution of a current block of instruction words defining a current waveform on receipt of the starting instruction word of a subsequent block of instruction words.

12. The waveform generator of claim 11, wherein the internal control unit is configured to receive a reference tag from the system control unit and to sequentially shift the sequential access memory until one of the starting instruction words that contains an identification tag matching the received reference tag is moved to the memory output.

13. The waveform generator of claim 12, wherein each starting instruction word contains an enable code to selectively enable and disable repetition of overall symmetric waveform patterns, a symmetry type code, alternatively defining whether overall symmetry is even or odd, and a number of overall repetitions, defining how many times the overall sequence of steps is to be repeated; and wherein the internal control unit is configured to receive the starting instruction word of the current waveform and to repeat, as many times as the number of overall repetitions in the starting instruction word, the whole block of instructions words defining the current waveform if the enable code in the starting instruction word enables repetition of overall symmetric waveform patterns.

14. The waveform generator of claim 12, wherein each channel comprises a state inverter module configured to receive the driving signals from the memory output and having a normal operating mode in which the driving signals are passed unchanged, and an inverted operating mode in which the driving signals are inverted before being passed; and wherein the internal control unit is configured one of the normal operating mode and the inverted operating mode based on the enable code in the starting instruction word.

15. The waveform generator of claim 1, wherein the sequential access memory has a sequential upload input and the system control unit is configured to sequentially upload blocks of instruction words defining respective waveforms into the sequential access memory through the sequential upload input.

16. An electronic system, comprising:
an array of transducers configured to generate waves in response to driving signals; and
a waveform generator configured to generate the driving signals, wherein said waveform generator comprises:
a system control unit; and
a plurality of channels controlled by the system control unit and configured to supply a corresponding plurality of driving signals, wherein each driving signal is configured to drive a respective transducer of an array of transducers;
wherein each channel comprises:
a sequential access memory having a plurality of rows, wherein each row stores an instruction word configured to generate a respective step of a waveform, and a memory output defined by an output row at a fixed location, wherein the waveform is defined by a block of instruction words; and
an internal control unit configured to sequentially move instruction words of the sequential access memory, based on the instruction word currently at the memory output, so that sequences of instruction words are provided at the output row.

17. The system of claim 16, wherein the transducers include piezoelectric transducers.

18. A waveform generator channel circuit configured to generate a driving signal, comprising:
a sequential access memory having a plurality of rows, wherein each row stores an instruction word configured to generate a respective step of a waveform, and a memory output defined by an output row at a fixed location, wherein the waveform is defined by a block of instruction words; and
a control unit configured to sequentially move instruction words of the sequential access memory, based on the instruction word currently at the memory output, so that sequences of instruction words are provided at the output row.

19. The waveform generator channel circuit of claim 18, wherein the sequential access memory comprises a two-dimensional shift register formed by said plurality of rows, configured to be shifted by rows selectively in one of a first direction and a second direction, wherein the second direction is opposite to the first direction.

20. The waveform generator channel circuit of claim 19, wherein the internal control unit is configured to shift the sequential access memory based on the content of the instruction word currently at the memory output.

21. The waveform generator channel circuit of claim 18, wherein the sequential access memory comprises a plurality of bidirectional, circular, unidimensional shift registers forming columns of the sequential access memory, wherein said bidirectional, circular, unidimensional shift registers are all of a same size and are configured to be operated in parallel.

22. The waveform generator channel circuit of claim 21, wherein the bidirectional, circular, unidimensional shift registers are configured to simultaneously receive a single shift command that has a first logic value causing content of all the bidirectional, circular, unidimensional shift registers to be shifted in a first direction and a second logic value causing content of all the bidirectional, circular, unidimensional shift registers to be shifted in a second direction, wherein the second direction is opposite to the first direction.

23. The waveform generator channel circuit of claim 22, wherein the control unit is configured to shift all the bidirectional, circular, unidimensional shift registers based on the content of the instruction word currently at the memory output.

24. The waveform generator channel circuit of claim 18, wherein the instruction word contains local sequence delimiters of sequences of instruction words to be repeated, and wherein the internal control unit is configured to invert a shift direction of the sequential access memory in response to the local sequence delimiters and inversion conditions.

25. The waveform generator channel circuit of claim 24, wherein the instruction word containing the local sequence delimiters also contains repetition information defining a number of repetitions to be carried out for respective sequences of words to be repeated.

26. The waveform generator channel circuit of claim 18, wherein the instruction word contains a duration and a state value of a respective driving signal defining a respective step of the waveform to be generated.

27. The waveform generator channel circuit of claim 18, wherein a starting instruction word of a block of instruction words defining the waveform contains an identification tag identifying the waveform.

28. The waveform generator channel circuit of claim 27, wherein the sequential access memory contains a plurality of blocks of instruction words, each block of instruction words defining a respective waveform and having a respective one of the starting instruction words, and wherein the control unit is configured to stop execution of a current block of instruction words defining a current waveform on receipt of the starting instruction word of a subsequent block of instruction words.

29. The waveform generator channel circuit of claim 28, wherein the control unit is configured to receive a reference tag from the system control unit and to sequentially shift the sequential access memory until one of the starting instruction words that contains an identification tag matching the received reference tag is moved to the memory output.

30. The waveform generator channel circuit of claim 29, wherein each starting instruction word contains an enable code to selectively enable and disable repetition of overall symmetric waveform patterns, a symmetry type code, alternatively defining whether overall symmetry is even or odd, and a number of overall repetitions, defining how many times the overall sequence of steps is to be repeated; and wherein the control unit is configured to receive the starting instruction word of the current waveform and to repeat, as many times as the number of overall repetitions in the starting instruction word, the whole block of instructions words defining the current waveform if the enable code in the starting instruction word enables repetition of overall symmetric waveform patterns.

31. The waveform generator channel circuit of claim 30, wherein each channel comprises a state inverter module configured to receive the driving signals from the memory output and having a normal operating mode in which the driving signals are passed unchanged, and an inverted operating mode in which the driving signals are inverted before being passed; and wherein the internal control unit is configured one of the normal operating mode and the inverted operating mode based on the enable code in the starting instruction word.

32. The waveform generator channel circuit of claim 18, wherein the sequential access memory has a sequential upload input through which blocks of instruction words defining respective waveforms are sequentially uploaded into the sequential access memory.

* * * * *